United States Patent
Ichikawa et al.

(10) Patent No.: US 7,595,561 B2
(45) Date of Patent: Sep. 29, 2009

(54) SEMICONDUCTOR DEVICE INCLUDING MULTIPLE ROWS OF PERIPHERAL CIRCUIT UNITS

(75) Inventors: Shingo Ichikawa, Kanagawa (JP); Miho Hirai, Kanagawa (JP)

(73) Assignee: Nec Electronics Corporation, Kanagawa (JP)

( * ) Notice: Subject to any disclaimer, the term of this patent is extended or adjusted under 35 U.S.C. 154(b) by 364 days.

(21) Appl. No.: 11/334,355

(22) Filed: Jan. 19, 2006

(65) Prior Publication Data

US 2006/0157856 A1 Jul. 20, 2006

(30) Foreign Application Priority Data

Jan. 19, 2005 (JP) .............................. 2005-011131

(51) Int. Cl.
*H01L 23/48* (2006.01)

(52) U.S. Cl. .................... 257/786; 257/208; 257/691; 257/773; 257/784

(58) Field of Classification Search ................ 257/202, 257/203, 207, 208, 691, 773, 784, 786
See application file for complete search history.

(56) References Cited

U.S. PATENT DOCUMENTS

| | | | |
|---|---|---|---|
| 6,008,542 A * | 12/1999 | Takamori | 257/773 |
| 6,130,484 A * | 10/2000 | Kameda et al. | 257/786 |
| 6,287,482 B1 * | 9/2001 | Hamura et al. | 257/202 |
| 6,707,164 B2 * | 3/2004 | Cheng et al. | 257/786 |
| 6,836,026 B1 * | 12/2004 | Ali et al. | 257/786 |
| 7,397,138 B2 * | 7/2008 | Ohnishi et al. | 257/786 |

FOREIGN PATENT DOCUMENTS

| | | |
|---|---|---|
| JP | 11-087399 | 3/1999 |
| JP | 2003-163267 | 6/2003 |

* cited by examiner

*Primary Examiner*—Ori Nadav
(74) *Attorney, Agent, or Firm*—Young & Thompson

(57) ABSTRACT

In a semiconductor device including an internal circuit, multiple rows of peripheral circuit units are electrically connected to the internal circuit and arranged on at least one peripheral edge of the internal circuit. Also, a plurality of pads are arranged on the peripheral edge of the internal circuit. Each of the pads is electrically connected to one of the peripheral circuit units.

7 Claims, 12 Drawing Sheets

SEMICONDUCTOR DEVICE INCLUDING MULTIPLE ROWS OF PERIPHERAL CIRCUIT UNITS

BACKGROUND OF THE INVENTION

1. Field of the Invention

The present invention relates to a semiconductor device including an internal circuit defined by an active area, a plurality of peripheral circuit units arranged on the peripheral of the internal circuit and a plurality of pads arranged on the peripheral of the internal circuit facing the peripheral circuit units.

2. Description of the Related Art

A typical semiconductor device is constructed by an internal circuit, a single row of peripheral circuit units connected to the internal circuit and arranged on at least one peripheral edge of the internal circuit such as input/output (I/O) circuit units, power supply circuit units and ground circuit units, a plurality of pads each connected to one of the peripheral circuit units.

As the multi-function and integration of semiconductor devices have been developed, the number of pads and the number of peripheral circuit units have been increased, so that the pitch of pads and the pitch of peripheral circuit units have been narrowed.

In order to substantially widen the pitch of pads, a first prior art semiconductor device is constructed by locating the pads in a zigzagged (staggered) arrangement (see: JP-11-87399-A and JP-2003-163267-A). This will be explained later in detail.

In the above-described first prior art semiconductor device, however, although the pitch of pads is substantially widened, the pitch of peripheral circuit units is never widened. As a result, when the number of the pads and the number of peripheral circuit units are increased, the width of each of the peripheral circuit units along the peripheral direction is decreased, so that the width of interconnections between the pads and the peripheral circuit units is decreased, which would limit current supplied from the pads to the peripheral circuit units and vice versa. Also, the width of interconnections between the peripheral circuit units and the internal circuit is decreased to limit currents supplied from the peripheral circuit units to the internal circuit and vice versa. Further, since the peripheral circuit units are very elongated, the flexibility of the layout design of transistor elements within the peripheral circuit units is limited.

Additionally, in order to compensate for the narrowed pitch of peripheral circuit units, a second prior art semiconductor device is constructed by locating all or part of pads immediately above the peripheral circuit units (see: JP-2003-163267-A). These pads are called circuit-under-pad (CUP) pads. This also will be explained later in detail.

Even the above-described second prior art semiconductor device has the same problems as the first prior art semiconductor device, although the area of the peripheral circuit units or the area of the internal circuit can be increased.

SUMMARY OF THE INVENTION

It is an object of the present invention to provide a semiconductor device capable of widening the pitch of peripheral circuit units.

According to the present invention, in a semiconductor device including an internal circuit, multiple rows of peripheral circuit units are electrically connected to the internal circuit and arranged on at least one peripheral edge of the internal circuit. Also, a plurality of pads are arranged on the peripheral edge of the internal circuit. Each of the pads is electrically connected to one of the peripheral circuit units.

BRIEF DESCRIPTION OF THE DRAWINGS

The present invention will be more clearly understood from the description set forth below, as compared with the prior art, with reference to the accompanying drawings, wherein.

DESCRIPTION OF THE PREFERRED EMBODIMENTS

Before the description of the preferred embodiments, prior art semiconductor devices will be explained with reference to FIGS. 1, 2, 3, 4 and 5.

Figure 1:
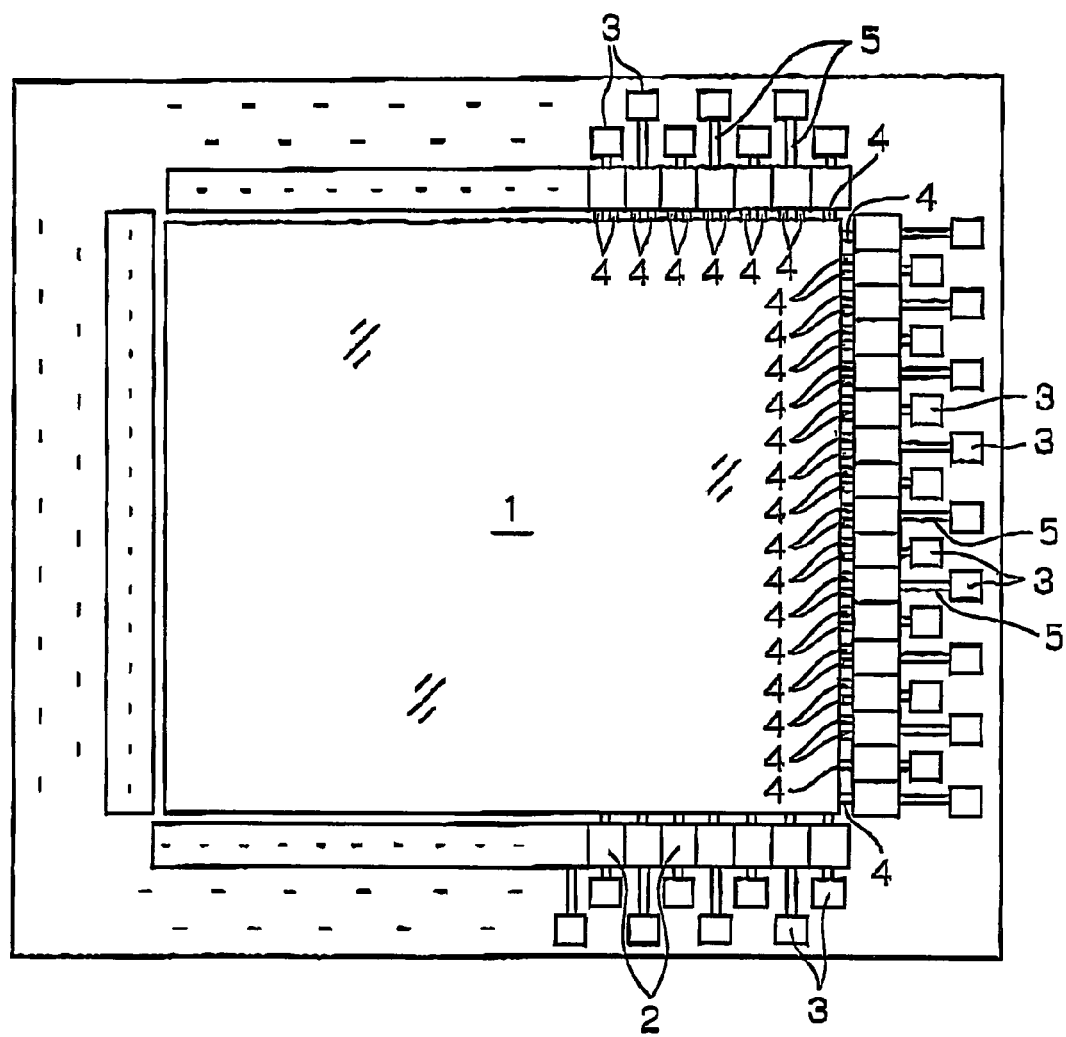
FIG. 1 is a layout diagram illustrating a first prior art semiconductor device.

In FIG. 1, which illustrates a first prior art semiconductor device (see: JP-11-87399-A & JP-2003-163267-A), reference numeral 1 designates an internal circuit defined by an active area connected to a single row of peripheral circuit units 2 arranged on the periphery of the internal circuit 1. Each of the peripheral circuit units 2 is connected to one of pads 3.

The pads 3 are located in a zigzagged (staggered) arrangement, so that the area of the pads 3 can be increased, thus substantially widening the pitch of the pads 3.

One or more interconnections 4 are provided between the internal circuit 1 and one of the peripheral circuit units 2. Also, one interconnection 5 is provided between one of the peripheral circuit units 2 and its corresponding one of the pads 3.

Figure 2:
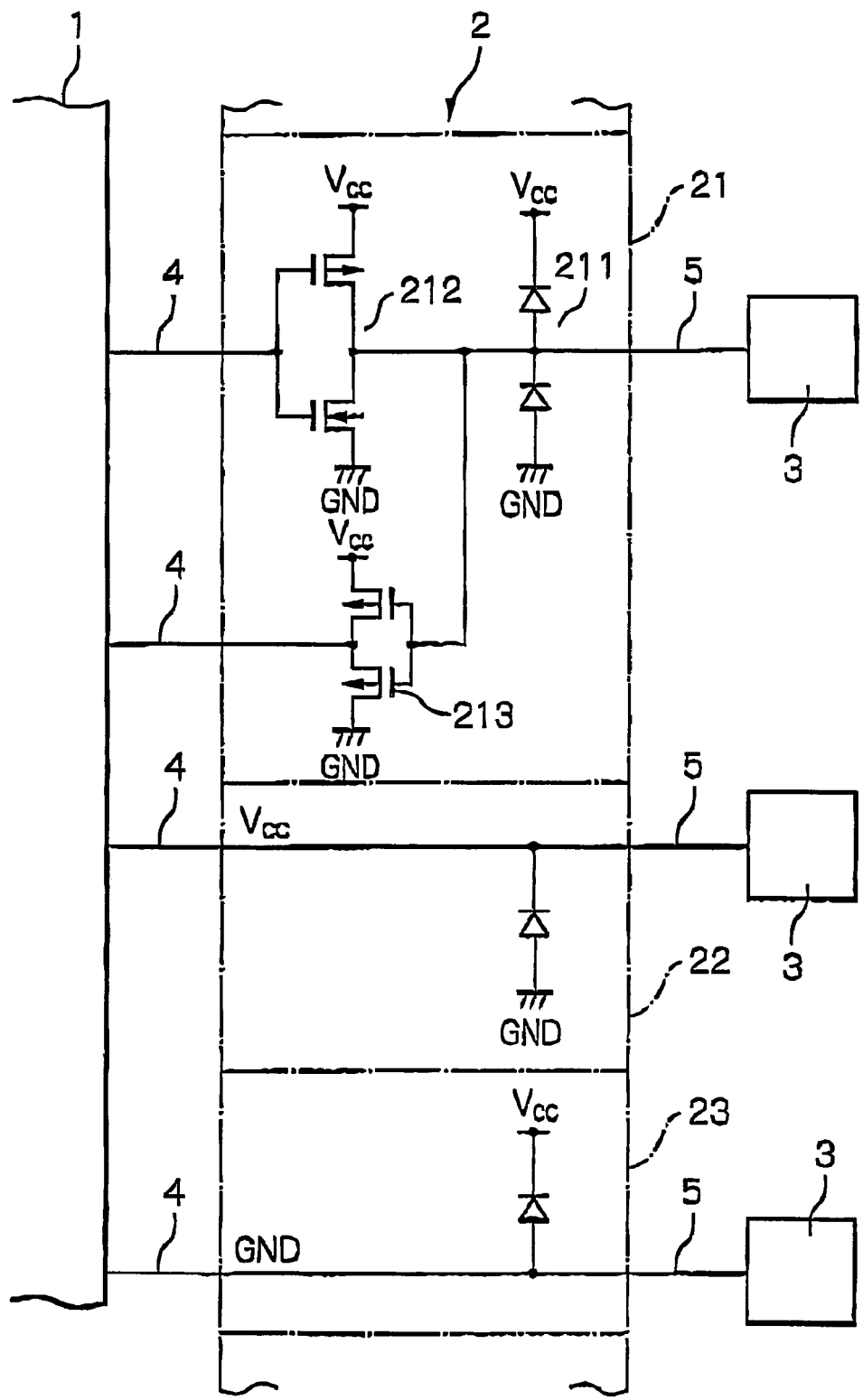
FIG. 2 is a circuit diagram of the peripheral circuit units of FIG. 1.

In FIG. 2, which is a circuit diagram of the peripheral circuit units 2 of FIG. 1, the peripheral circuit units 2 are divided into three kinds of peripheral circuit units 21, 22 and 23, i.e., an I/O circuit unit 21, a power supply circuit unit 22 and a ground circuit unit 23.

The I/O circuit unit 21 is constructed by a protection circuit 211 formed by two diode-connected MOS transistors, an output buffer 212 formed by a P-channel MOS transistor and an N-channel MOS transistor, and an input buffer 213 formed by a P-channel MOS transistor and an N-channel MOS transistor. In this case, the pad 3 connected to the I/O circuit unit 21 is called a signal pad. Also, the power supply circuit unit 22 is constructed by a protection circuit formed by a diode-connected MOS transistor. In this case, the pad 3 connected to the power supply circuit 22 is called a power supply pad. Further, the ground circuit unit 23 is constructed by a protection circuit formed by a diode-connected MOS transistor. In this case, the pad 3 connected to the ground circuit unit 23 is called a ground pad.

Note that the power supply voltage $V_{cc}$ of the power supply circuit 22 is applied to the terminals ($V_{cc}$) of the I/O circuit unit 21 and the ground circuit-unit 23 by interconnections (not shown). Similarly, the ground voltage GND of the ground circuit unit 23 is applied to the terminals (GND) of the I/O circuit unit 21 and the power supply circuit unit 22 by interconnections (not shown).

Other types of peripheral circuit units can be applied to the peripheral circuit units 2. For example, the output buffer 212 of the I/O circuit unit 21 can be adapted to receive an enable signal from the internal circuit 1. Also, a plurality of output buffers can be provided in the I/O circuit unit 21. Further, an output buffer with a protection circuit and an input buffer with a protection circuit can be individually provided.

Figure 3:
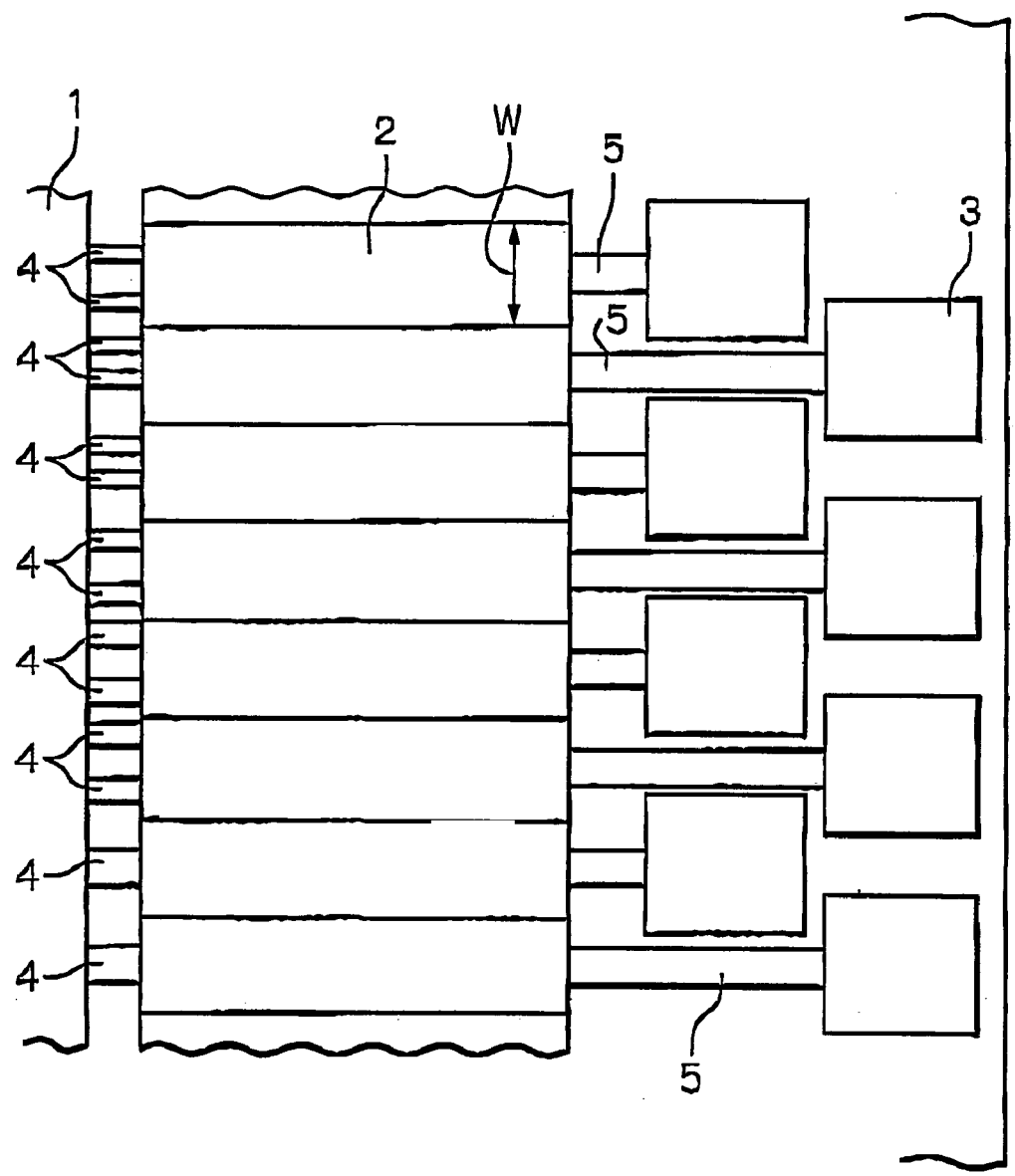
FIG. 3 is a partial enlargement of the device of FIG. 1 for explaining the problems therein.

As illustrated in FIG. 3, which is a partial enlargement of the device of FIG. 1, when the number of the pads 3 and the number of peripheral circuit units 2 are increased, the width W of each of the peripheral circuit units 2 along the peripheral direction is decreased, so that the width of the interconnections 5 between the pads 3 and the peripheral circuit units 2 is decreased, which would limit current supplied from the pads 3 to the peripheral circuit units 2 and vice versa. Particularly, since the interconnections 5 between the pads 3 on the outer side and the peripheral circuit units 2 need to pass between the pads 3 on the inner side, the width of such interconnections 5 needs to be further decreased.

Also, the width of the interconnections 4 between the peripheral circuit units 2 and the internal circuit 1 is decreased to limit currents supplied from the peripheral circuit units 2 to the internal circuit 1 and vice versa.

Further, since the peripheral circuit units 2 are very elongated, the layout design of the transistor elements within the peripheral circuit units 2 is limited.

Figure 4:
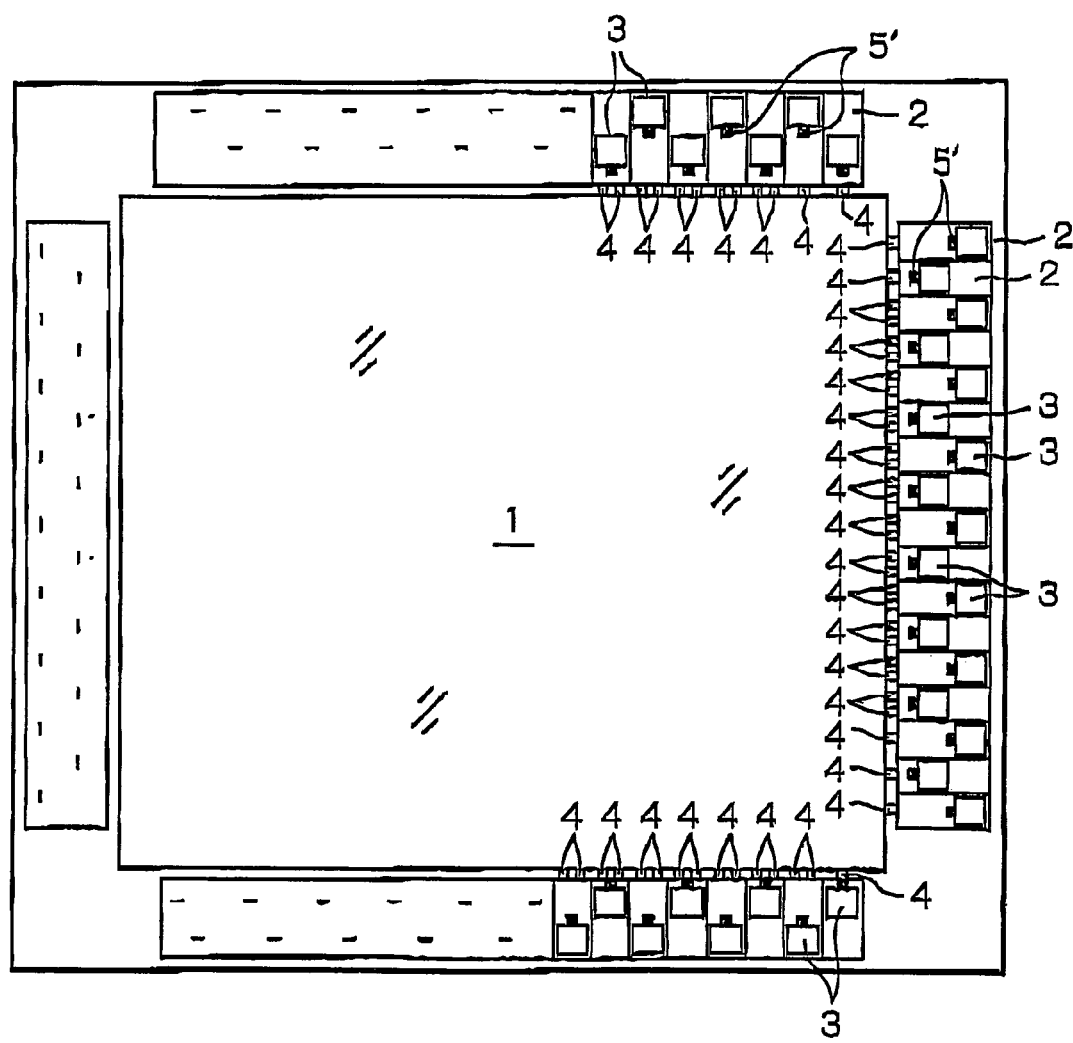
FIG. 4 is a layout diagram illustrating a second prior art semiconductor device.

In FIG. 4, which illustrates a second prior art semiconductor device (see; JP-2003-163267-A), the pads 3 are located immediately above the peripheral circuit units 2. These pads 3 are called CUP pads. In this case, interconnections 5' formed by contact structures instead of the interconnections 5 of FIG. 1 are provided between the peripheral circuit units 2 and the pads 3. Thus, the area of the peripheral circuit units 2 or the area of the internal circuit 1 can be increased as compared with the device of FIG. 1.

Figure 5:
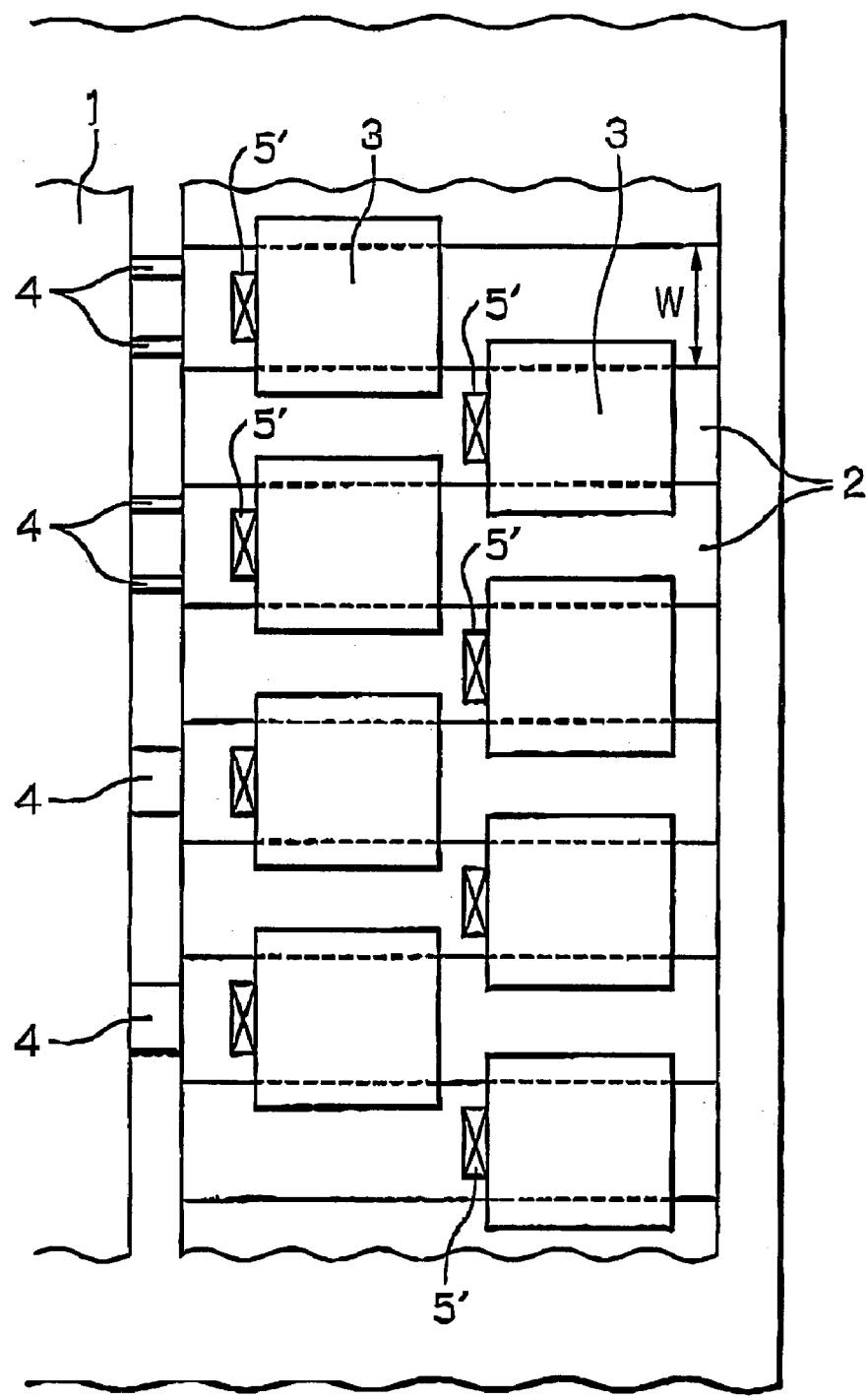
FIG. 5 is a partial enlargement of the device of FIG. 1 for explaining the problems therein.

As illustrated in FIG. 5, which is a partial enlargement of the device of FIG. 4, when the number of the pads 3 and the number of peripheral circuit units 2 are increased, the width W of each of the peripheral circuit units 2 along the peripheral direction is decreased, so that the width of the interconnections 5' between the pads 3 and the peripheral circuit units 2 is decreased, which would limit current supplied from the pads 3 to the peripheral circuit units 2 and vice versa.

Also, the width of the interconnections 4 between the peripheral circuit units 2 and the internal circuit 1 is decreased to limit currents supplied from the peripheral circuit units 2 to the internal circuit 1 and vice versa.

Thus, the semiconductor device of FIG. 4 has the same problems as that of FIG. 1.

Figure 6:
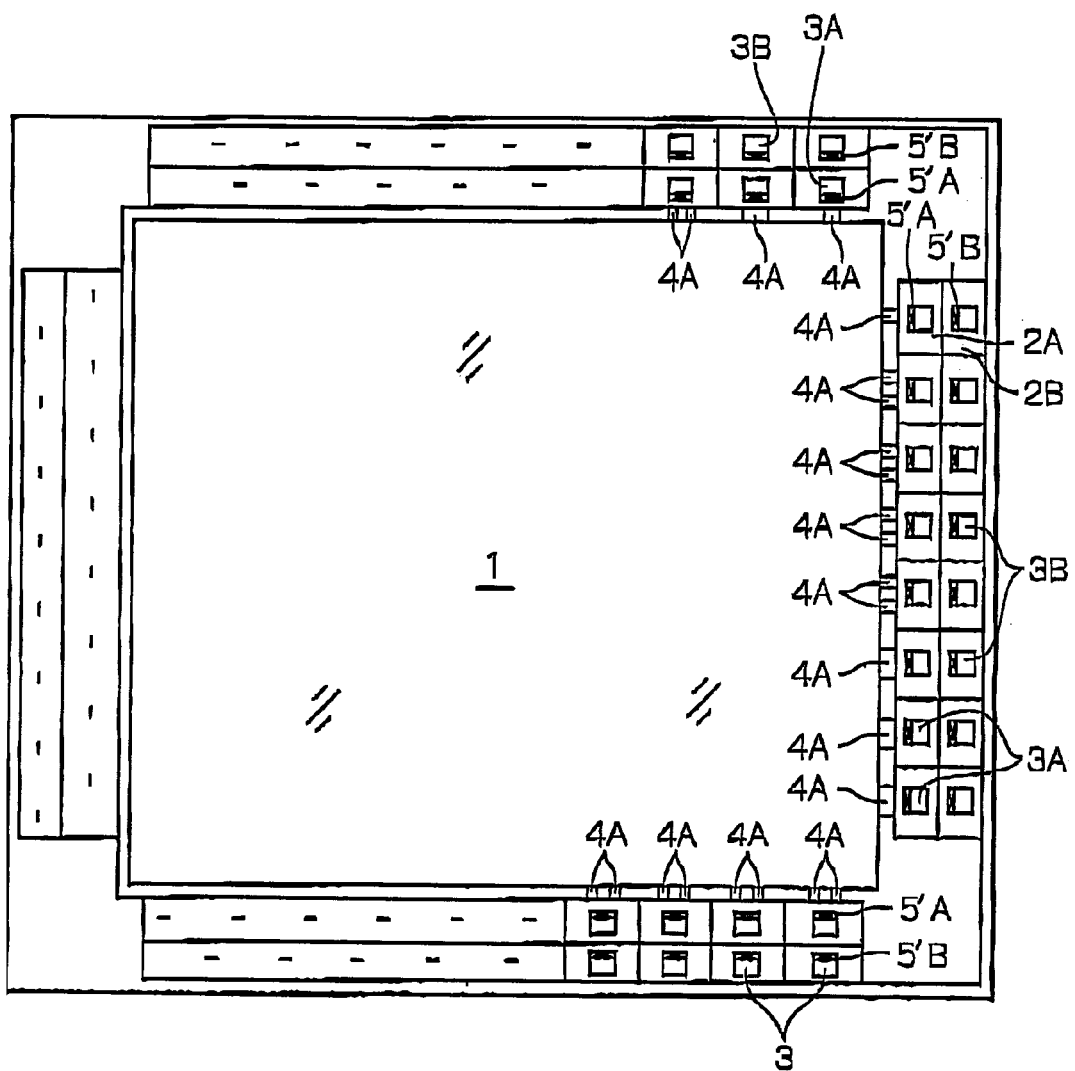
FIG. 6 is a layout diagram illustrating a first embodiment of the semi-conductor device according to the present invention.

In FIG. 6, which illustrates a first embodiment of the semiconductor device according to the present invention, double rows of peripheral circuit units 2A and 2B having substantially the same dimensions are provided instead of the single row of the peripheral circuit units 2 of FIG. 4. Also, double rows of CUP pads 3A and 3B having substantially the same dimensions are located immediately above the double rows of the peripheral circuit units 2A and 2B, respectively. Further, interconnections 4A are provided between the internal circuit 1 and the peripheral circuit units 2A, and interconnections 4B (not shown) are provided between the internal circuit 1 and the peripheral circuit units 2B. Additionally, interconnections 5'A formed by contact structures are provided between the peripheral circuit units 2A and the pads 3A, and interconnections 5'B formed by contact structures are provided between the peripheral circuit units 2B and the pads 3B.

In FIG. 6, since the peripheral circuit units 2A and 2B form double rows, the width along the peripheral direction can be about twice as compared with that of FIGS. 1 and 4. As a result, the pitch of the peripheral circuit units 2A and 2B can be widened. Also, since the peripheral circuit units 2A and 2B are not so elongated, the flexibility of the layout design of transistor elements therein can be enhanced.

Figure 7:
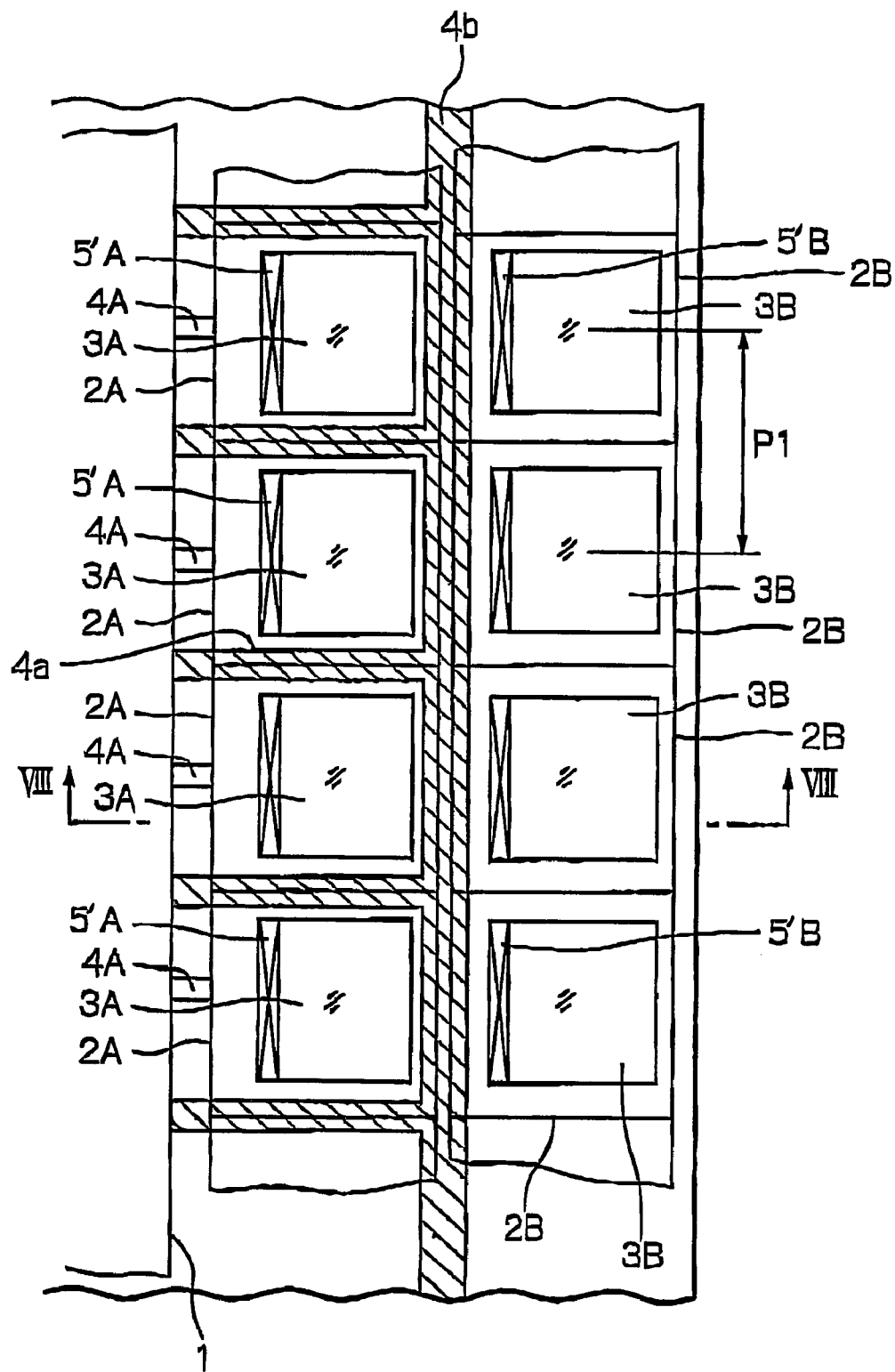
FIG. 7 is a partial enlargement of the device of FIG. 6.

In FIG. 7, which is a partial enlargement of the device of FIG. 6, the peripheral circuit units 2A on the inner-side are located closely facing the peripheral circuit units 2B on the outer-side. As a result, the pitch of the peripheral circuit units 2A and the pitch of the peripheral circuit units 2B are the same (=P1).

Also, each of the peripheral circuit units 2A and 2B is approximately square, so that each of the pads 3A and 3B is also approximate square. However, if the pads 3A are used only for wire bonding and the pads 3B are used for test probing as well as wire bonding, the pads 3A can be rectangular.

The interconnections 4B (not shown) between the internal circuit 1 and the peripheral circuit unit 2B are provided in shaded areas 4a and 4b.

As illustrated in FIG. 7, the width of the interconnections 5'A and 5'B along the peripheral direction is the same as that of the pads 3A and 3B, respectively. Note that the width of the interconnections 5'A and 5'B can be larger than that of the pads 3A and 3B, respectively, with being smaller than that of the peripheral circuit units 2A and 2B, respectively, thus ensuring a desired electric ability as well as reducing resistance values and capacitance values of the interconnections 5'A and 5'B, which would be helpful in high speed operation. Particularly, a larger output power of an output buffer can be obtained.

Figure 8:
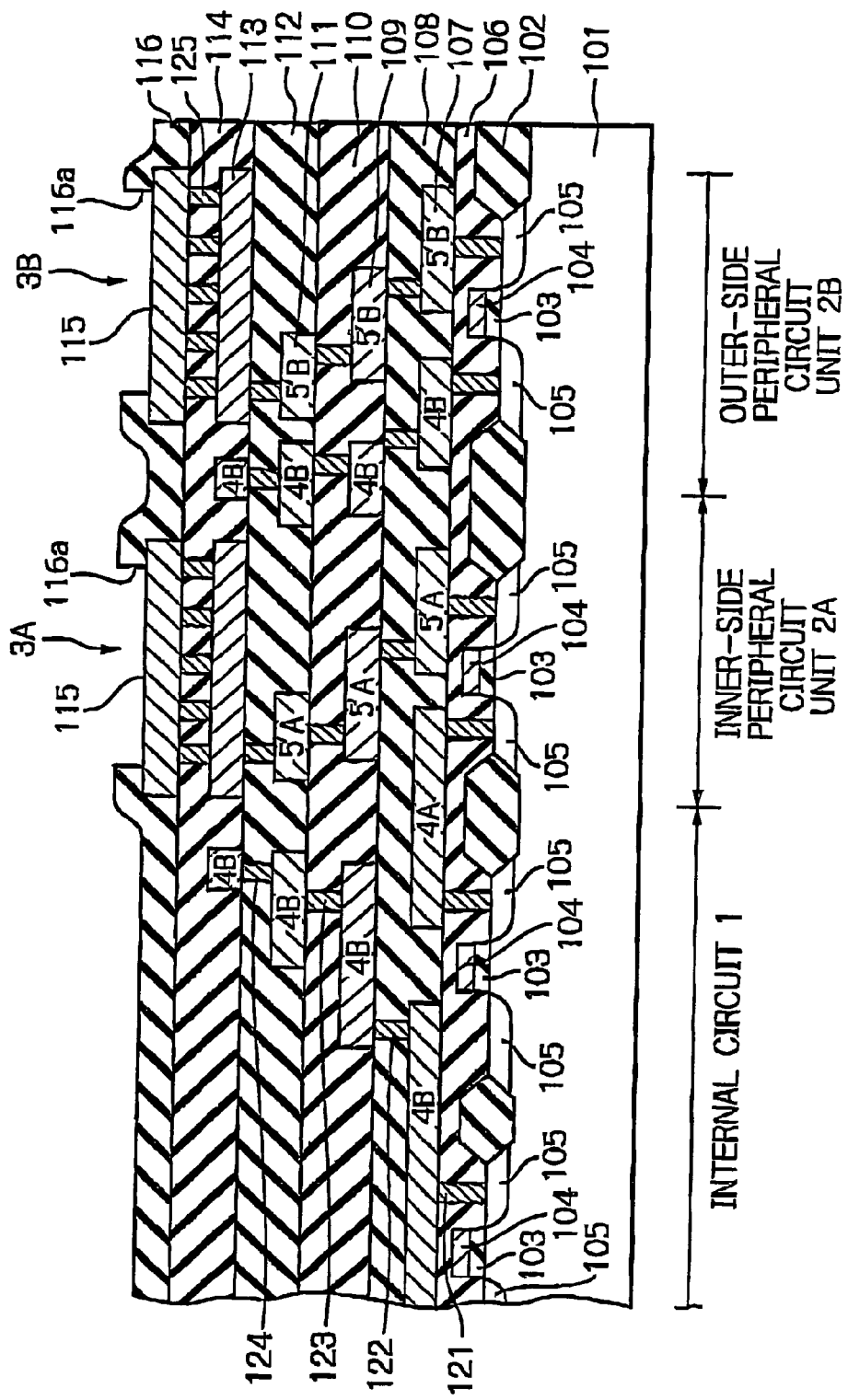
FIG. 8 is a cross-sectional view taken along the line VIII-VIII of FIG. 6.

In FIG. 8, which is a cross-sectional view taken along the line VIII-VIII in FIG. 7, reference numeral 101 designates a silicon substrate on which an isolation insulating layer 102 is formed to partition active areas.

In the active areas, gate insulating layers 103, gate electrodes 104 formed on the gate insulating layers 103 and impurity diffusion regions 105 in self-alignment with the gate electrodes 104 are formed to form MOS transistor elements of the internal circuit 1, the inner-side peripheral circuit unit 2A and the outer-side peripheral circuit unit 2B.

Also, an insulating layer 106, a conductive layer 107, an insulating layer 108, a conductive layer 109, an insulating layer 110, a conductive layer 111, an insulating layer 112, a conductive layer 113, an insulating layer 114, a conductive layer 115, and a passivation layer 116 are sequentially formed. In this case, the insulating layers 106, 108, 110, 112 and 114 are made of silicon dioxide, for example, the conductive layers 107, 109, 111, 113 and 115 are made of aluminum, for example, and the passivation layer 116 is made of boron-included phospho-silicated glass (BPSG). Also, via (contact) structures 121, 122, 123, 124 and 125 made of tungsten (W) or the like are provided in the insulating layers 106, 108, 110, 112 and 114, respectively, for electrical connections between two opposing conductive layers including the impurity diffusion regions 105.

The conductive layer 115 is exposed from openings 116*a* of the passivation layer 116. The conductive layer 115 is combined by the via structure 125 to form the pads 3A and 3B.

The MOS transistor of the internal circuit 1 is electrically connected via the conductive layer 107 serving as the interconnection 4A to the MOS transistor of the inner-side peripheral circuit unit 2A.

The MOS transistor of the internal circuit 1 is electrically connected via the conductive layer 114 serving as the interconnection 4B in the shaded area 4*b* of FIG. 7 to the outer-side peripheral circuit unit 2B.

The MOS transistor of the inner-side peripheral circuit unit 2A is electrically connected via the conductive layers 107, 109 and 111 serving as the interconnection 5A to the pad 3A.

The MOS transistor of the outer-side peripheral circuit unit 2B is electrically connected via the conductive layers 107, 109 and 111 serving as the interconnection 5B to the pad 3B.

Figure 9:
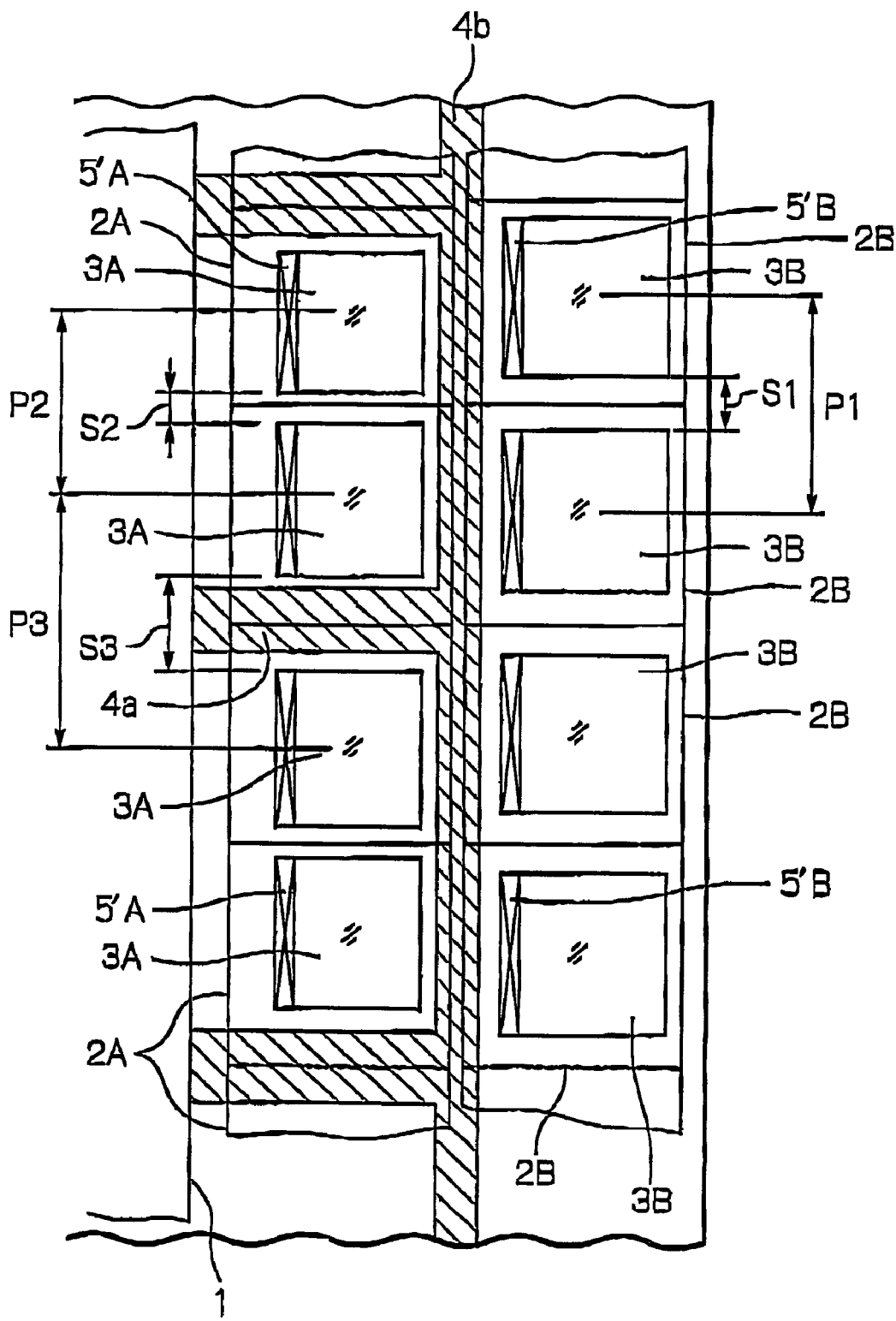
FIG. 9 is a layout diagram illustrating a modification of FIG. 7.

In FIG. 9, which is a modification of FIG. 7, the pitches of the pads 3A on the inner-side are alternately changed. That is, two adjacent pitches P2 and P3 of the pads 3A are different from each other:

P2<P3 where P2+P3=2·P1. As a result, the two adjacent spacings S2 and S3 of the pads 3A are different from each other:

S2<S1<S3 where S1 is the spacing of the pads 3B on the outer-side. Therefore, the interconnections 4B between the internal circuit 1 and the two pads 3B can be provided only at the larger spacing S3, not at the smaller spacing S2. As a result, the substantial pitch between the pads 3A can be increased, thus ensuring a desired electric ability as well as reducing resistance values and capacitance values of the interconnections 4B, which would be helpful in high speed operation.

Figure 10:
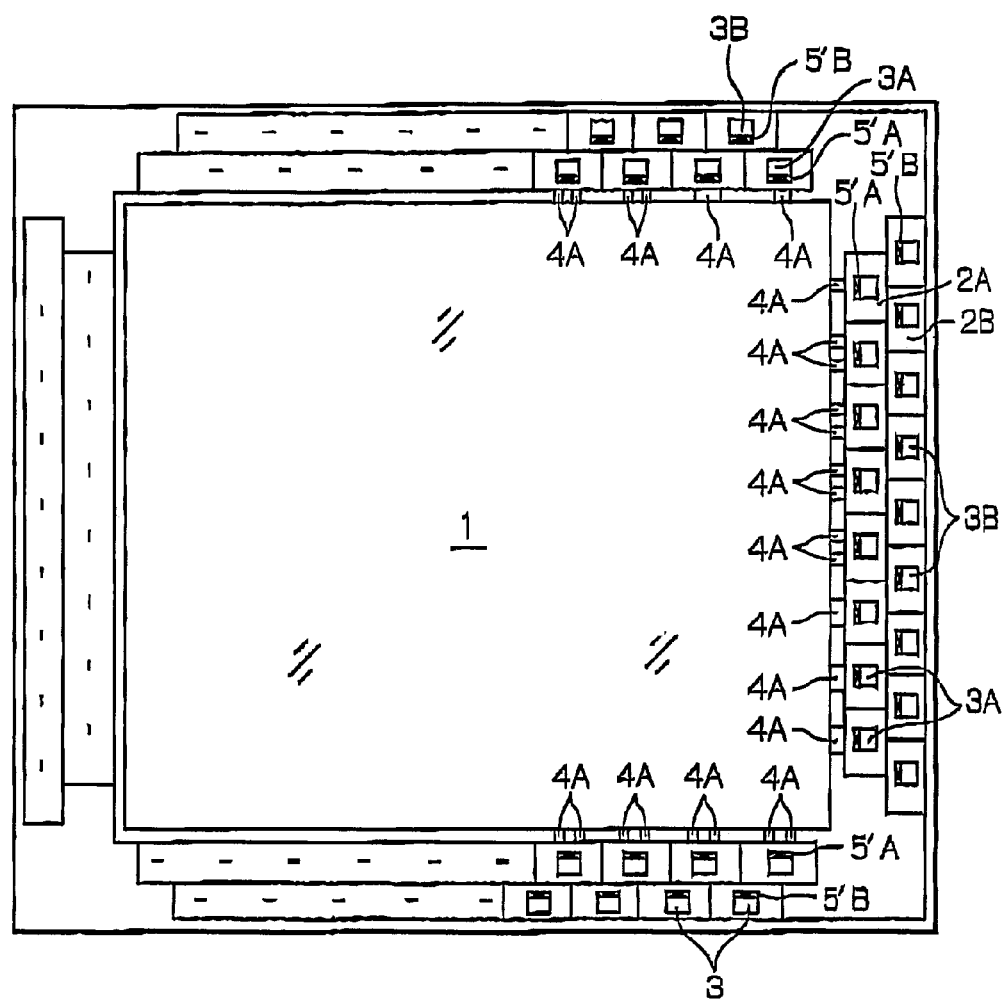
FIG. 10 is a layout diagram illustrating a second embodiment of the semiconductor device according to the present invention.
Figure 11:
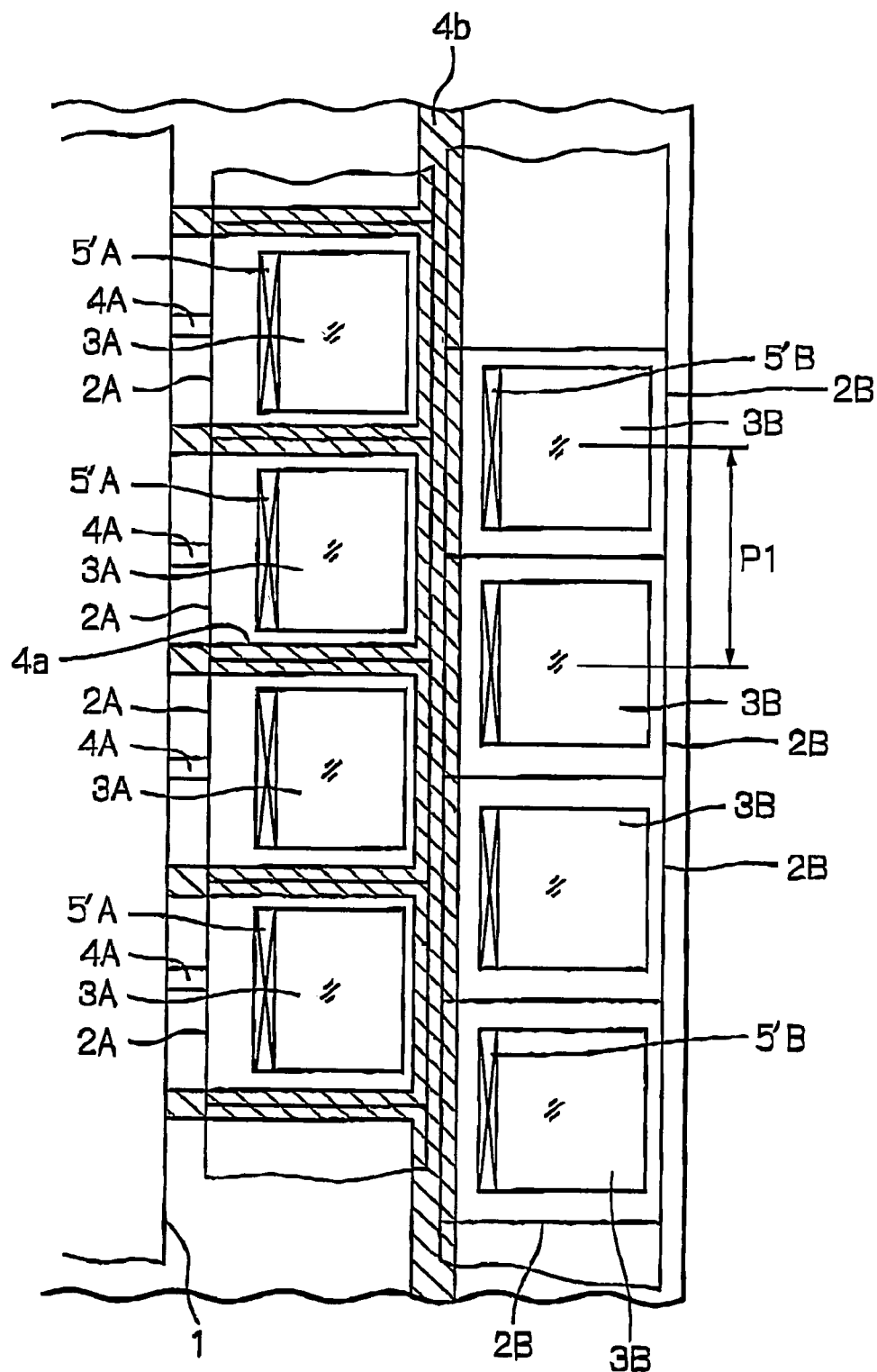
FIG. 11 is a partial enlargement of the device of FIG. 10.

FIG. 10 illustrates a second embodiment of the semiconductor device according to the present invention, and FIG. 11 is a partial enlargement of the device of FIG. 10. In FIGS. 10 and 11, the row of the peripheral circuit units 2B is shifted by half pitch with respect to the row of the peripheral circuits 2A, so that the peripheral circuit units 2A and 2B are located in a zigzagged (staggered) arrangement, i.e., the pads 3A and 3B are located in a zigzagged (staggered) arrangement. As a result, short-circuits hardly occur between external connections such as bonding wires and test probes connected to the pads 3A and 3B.

Figure 12:
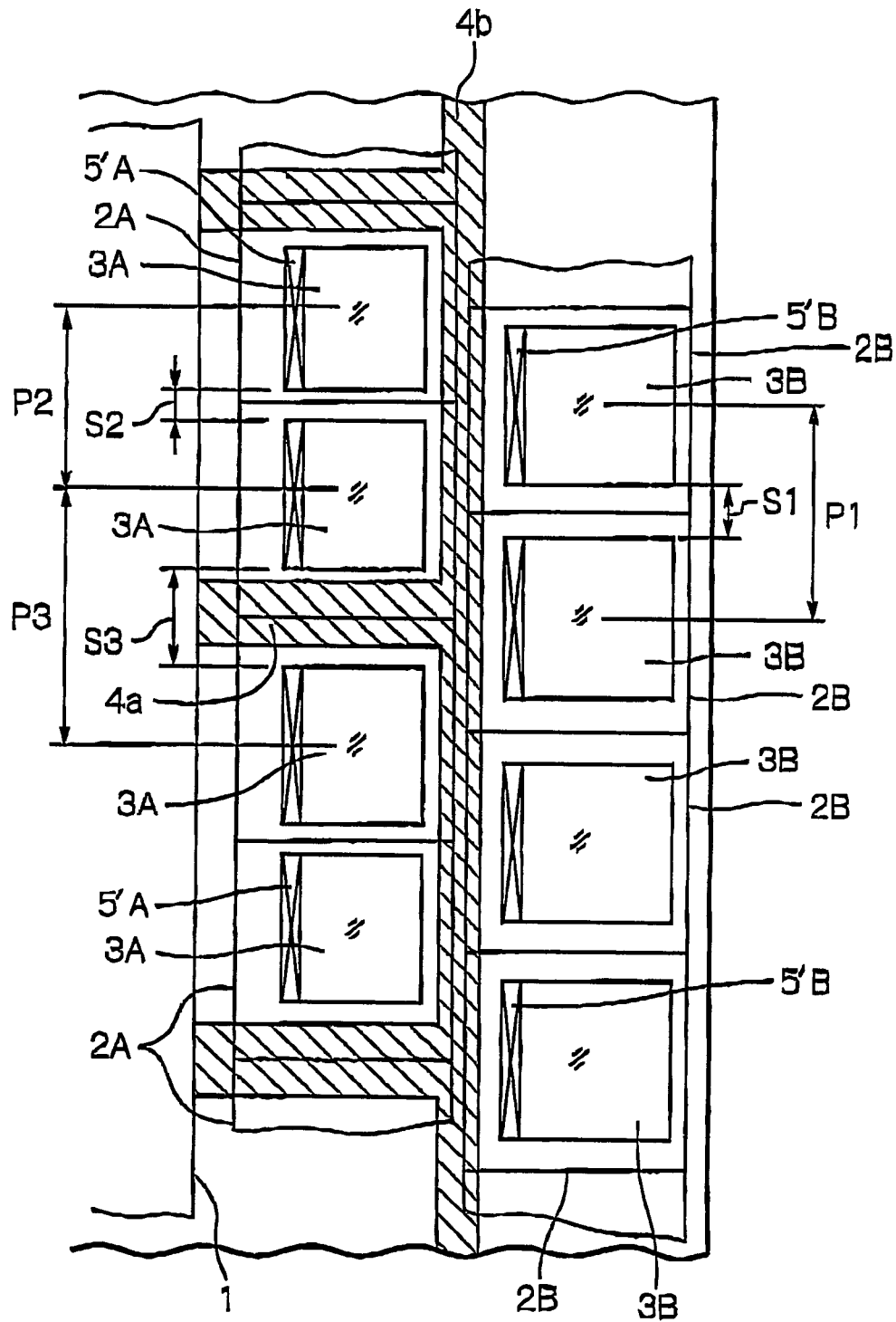
FIG. 12 is a layout diagram illustrating a modification of FIG. 11.

In FIG. 12, which is a modification of FIG. 11, the pitches of the pads 3A on the inner side are alternately changed. That is, two adjacent pitches P2 and P3 of the pads 3A are different from each other:

P2<P3 where P2+P3=2·P1. As a result, the two adjacent spacings S2 and S3 of the pads 3A are different from each other:

S2<S1<S3 where S1 is the spacing of the pads 3B on the outer side. Therefore, the interconnections 4B between the internal circuit 1 and the two pads 3B can be provided only at the larger spacing S3, not at the smaller spacing S2. As a result, the substantial pitch between the pads 3A can be increased, thus ensuring a desired electric ability as well as reducing resistance values and capacitance values of the interconnections 4B, which would be helpful in high speed operation.

In the above-described embodiments, doubled peripheral circuit units are provided on all peripheral edges of an internal circuit; however, in the present invention, such doubled peripheral circuit units can be provided on at least one peripheral edge of the internal circuit.

Also, the above-described embodiments relate to double rows of peripheral circuit units; however, the present invention can be applied to multiple rows of peripheral circuit units other than the double rows of peripheral circuit units.

As explained hereinabove, according to the present invention, since multiple rows of peripheral circuit units are provided on at least one peripheral edge of an internal circuit, the pitch of the peripheral circuit units can be widened.

The invention claimed is:

1. A semiconductor device comprising:
   an internal circuit;
   inner-side and outer-side peripheral circuit units electrically connected to said internal circuit and arranged on at least one peripheral edge of said internal circuit; and
   inner-side and outer-side pads, each of said inner-side pads being electrically connected to one of said inner-side peripheral circuit units, each of said outer-side pads being electrically connected to one of said outer-side peripheral circuit units,
   wherein said pads are circuit-under-pad (CUP) pads each immediately above one of said peripheral circuit units,
   wherein distances between centers of immediately adjacent pairs of said inner-side pads are alternately changed so that two different distances P2 and P3 are alternately set between centers of said inner-side pads, and a distance P1 between centers of immediately adjacent pairs of said outer-side pads is approximately uniform,
   wherein the distances P1 and P2 and P3 satisfy:

P2<P3; and

P2+P3=2·P1, and wherein spacings S2 and S3 between immediately adjacent sides of respective said immediately adjacent pairs of said inner-side pads and a spacing S1 between immediately adjacent sides of said immediately adjacent pairs of said outer-side pads satisfy:

S2<S1<S3.

2. The semiconductor device as set forth in claim 1, further comprising interconnections between said internal circuit and said outer-side peripheral circuit units, said interconnections being provided only in spacings S3 between said inner-side pads.

3. The semiconductor device as set forth in claim 2, wherein said interconnections are in a same layer as said pads.

4. The semiconductor device as set forth in claim 1, wherein said peripheral circuit units have similar dimensions to each other.

5. The semiconductor device as set forth in claim 1, wherein said pads have similar dimensions to each other.

6. The semiconductor device as set forth in claim 1, wherein each of said peripheral circuit units comprises one of an input/output circuit, a power supply circuit and a ground circuit.

7. The semiconductor device as set forth in claim 1, wherein said pads comprise signal pads, power supply pads and ground pads.

* * * * *

UNITED STATES PATENT AND TRADEMARK OFFICE
CERTIFICATE OF CORRECTION

PATENT NO. : 7,595,561 B2  Page 1 of 1
APPLICATION NO. : 11/334355
DATED : September 29, 2009
INVENTOR(S) : Ichikawa et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 436 days.

Signed and Sealed this

Twenty-eighth Day of September, 2010

David J. Kappos
*Director of the United States Patent and Trademark Office*